United States Patent
Weis et al.

(10) Patent No.: US 10,410,963 B1
(45) Date of Patent: Sep. 10, 2019

(54) DEFORMED LAYER FOR SHORT ELECTRIC CONNECTION BETWEEN STRUCTURES OF ELECTRIC DEVICE

(71) Applicant: AT & S Austria Technologie & Systemtechnik Aktiengesellschaft, Leoben (AT)

(72) Inventors: Gerald Weis, St. Marein im Mürztal (AT); Hannes Voraberger, Graz (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/002,202

(22) Filed: Jun. 7, 2018

(51) Int. Cl.
| | |
|---|---|
| *H01L 21/56* | (2006.01) |
| *H01L 23/498* | (2006.01) |
| *H01L 23/522* | (2006.01) |
| *H01L 23/538* | (2006.01) |
| *H01L 23/31* | (2006.01) |
| *H05K 1/02* | (2006.01) |
| *H05K 7/02* | (2006.01) |
| *H05K 1/03* | (2006.01) |
| *H01L 23/64* | (2006.01) |

(52) U.S. Cl.
CPC .......... *H01L 23/4985* (2013.01); *H01L 21/56* (2013.01); *H01L 23/3157* (2013.01); *H01L 23/5226* (2013.01); *H01L 23/5385* (2013.01); *H01L 23/64* (2013.01); *H05K 1/0298* (2013.01); *H05K 1/0393* (2013.01); *H05K 7/026* (2013.01)

(58) Field of Classification Search
USPC ......................................................... 361/750
See application file for complete search history.

(56) References Cited

U.S. PATENT DOCUMENTS

| | | | |
|---|---|---|---|
| 6,084,294 A | 7/2000 | Tomita | |
| 2004/0150107 A1* | 8/2004 | Cha | ..................... H01L 23/3114 257/738 |
| 2013/0069218 A1 | 3/2013 | Seah | |
| 2017/0084579 A1 | 3/2017 | Shin et al. | |
| 2018/0211848 A1* | 7/2018 | Pu | ........................... H01L 21/56 |

FOREIGN PATENT DOCUMENTS

| | | |
|---|---|---|
| EP | 2 389 049 B1 | 3/2013 |
| JP | 2004-179300 A2 | 6/2004 |

* cited by examiner

Primary Examiner — Andargie M Aychillhum
(74) Attorney, Agent, or Firm — Robert A. Blaha; Smith Tempel Blaha LLC

(57) ABSTRACT

An electric device includes a first structure, a second structure, and a deformed layer. The deformed layer includes a dielectric matrix and electrically conductive elements formed therein. The deformed layer is arranged to electrically couple the first structure with the second structure.

20 Claims, 2 Drawing Sheets

DEFORMED LAYER FOR SHORT ELECTRIC CONNECTION BETWEEN STRUCTURES OF ELECTRIC DEVICE

TECHNICAL FIELD

Embodiments of the invention relate to an electric device and to a method of manufacturing an electric device.

TECHNOLOGICAL BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. In particular, a low loss electric connection of embedded components is desired. For example, component carriers with high I/O count and/or high-frequency signal transmission may be critical in this respect. Moreover, there is a strong tendency in the field of component carriers of continued miniaturization. In particular, it is desired to form electrically conductive connections with smaller and smaller dimensions. Thus, conventional procedures of contacting different layers of stacked layer-type component carriers reach their limits.

SUMMARY

There may be a need to efficiently and compactly establish electric connections in an electric device composed of multiple structures.

According to an exemplary embodiment of the invention, an electric device is provided which comprises a first structure, a second structure, and a deformed layer comprising a dielectric matrix and electrically conductive elements formed therein, wherein the deformed layer is arranged to electrically couple the first structure with the second structure.

According to another exemplary embodiment of the invention, a method of manufacturing an electric device it is provided, wherein the method comprises providing a first structure, providing a second structure, and electrically coupling the first structure with the second structure by a deformed layer comprising a dielectric matrix and electrically conductive elements.

OVERVIEW OF EMBODIMENTS

In the context of the present application, the term "electric device" may particularly denote any electric member, module or package in which two or more structures are functionally coupled and electrically connected via a deformed layer with electrically conductive elements therein.

In the context of the present application, the term "structure" may particularly denote an electric structure such as a physical body providing an electric or electronic functionality. Examples of such a structure are electronic chips, component carriers, electric packages or modules, etc.

In the context of the present application, the term "deformed layer" may particularly denote a curved, bent or otherwise three-dimensionally deformed layer which is deformed in such a way as to provide a shortened electric connection between structures via electrically conductive elements integrated within the deformed layer. The deformed layer may have a plurality of connected portions, wherein one or more of the portions may extend horizontally and one or more other of the portions may extend vertically.

According to an exemplary embodiment of the invention, an electric device is provided in which two or more (in particular electric) structures are electrically connected at least partially by a deformed layer having integrated electrically conductive elements. In view of the bent and very thin configuration of the deformed layer, it is possible to electrically connect the structures over a very short spatial distance (which may be for example as small as the thickness of the deformed layer itself). In particular, z-axis coupling of a plate shaped electric device may be accomplished very efficiently in this way. Thus, a highly compact electric device with short current paths can be provided allowing for an efficient and low-loss transport of electric signals and/or electric energy between the structures via the deformed layer. In view of the freely deformable shape of the deformed layer, it is possible for a circuit designer to highly flexibly establish substantially any desired coupling architecture by correspondingly bending the deformed layer.

With the architecture according to exemplary embodiments of the invention, heavy mechanical drill holes which are not that accurate in alignment and accuracy can be at least partially avoided. Moreover, impedance control of z-axis interconnections may become possible when involving a deformed layer for electrically coupling two structures. The concept of implementing a deformed layer with electrically conductive elements formed therein for electric and mechanical coupling purposes can be considered as a powerful alternative for conventional chip packaging systems. The high flexibility of such an electric device also introduces the possibility of new types of interconnections.

In the following, further exemplary embodiments of the method and the electric device will be explained.

In an embodiment, the deformed layer is a thermo-deformed layer or thermally deformed layer (for instance comprising a thermoplastic material). In the context of the present application, the term "thermally deformed" or "thermo-deformed" layer may particularly denote a layer processed by thermoforming. In particular, a thermally deformed layer may be the result of a manufacturing process in which a sheet of an appropriate material (for instance a dielectric (in particular plastic) sheet with embedded electrically conductive elements is heated to a pliable forming temperature, formed to a specific shape in a mold, and trimmed to create a (for instance three-dimensionally) bent thermally deformed layer. The layer, sheet, or film may be heated (for instance in an oven) to a sufficiently high temperature that permits it to be stretched into or onto a form, tool or structure and cooled to a finished shape. When configuring the deformed layer as a thermally deformed layer, it is possible to establish a desired deformation for accomplishing a desired electric connection pattern in a simple way by bringing the layer into a desired deformed configuration and fix the deformed layer in this state by the temporary application of thermal energy. For instance, it is possible to establish such a state by heating a thermally deformable material above a dedicated temperature, for instance a temperature in a range between 150° C. and 200° C. The thermo-deformed layer will then maintain its shape permanently after cooling down to ambient temperature and may therefore be capable of precisely serving as a tiny electric connection between two or more structures.

According to an embodiment of the invention, the material of the deformed layer (in particular a thermoplastic material) comprises at least one of the group consisting of Polyolefins such as Polypropylene (PP), Vinyl-Polymers such as PVC, Styrene based Polymers such as Polystyrene (PS), Polyacrylates such as Polymethylmetaclylate (PMMA), Polyacetals such as Polyoxymetlylene (POM), Fluoropolymers such as Polytetrafluoroethylene (PTFE), Polyamides including aromatic polyamides such as Polyphthalamide (PPA), Polycarbonate (PC) and Derivatives, Polyesters such as Polyethylene terephthalate (PET), Liquid Crystalline Polymers (LCP), Polyarylether such as Polyphenyleneether (PPE), Polyphenylenesulfone (PSU), Polyarylethersulfone (PES), Polyphenylensulfid (PPS), Polyetherketones such as Polyetheretherketone (PEEK), Polyimide (PI), Polyetherimide (PEI), Polyamidimide (PAI).

In this respect, it is mentioned that in particular the thermoplastic materials PEI, PES, and PSU and LCP may be of advantage because they a capable of withstanding temperatures up to 260° C. This means that these materials can be subjected to a typical reflow soldering process which usually is used in order to form a stable electric connection between the terminals of electronic components being assembled onto the component carrier and connection pads formed on the surface of the component carrier.

The materials PPE and LCP may be an appropriate choice in particular in case the component carrier is to be used for high frequency applications.

It has been experimentally proven by the inventors that in particular PEI can be processed in an easy and effective manner when it is existent within a fiber mesh material. This means that a thermoplastic reinforced fiber composite material may be formed which can be used as a prepreg for realizing the described component carrier. However, it is mentioned that also the other described thermoplastic materials can be used in the form of a composite material.

In an embodiment, at least one of the first structure and the second structure comprises one of the group consisting of a component carrier and a component. Thus, the first and/or the second structure may be substantially any electronic component or component carrier which shall be electrically and mechanically coupled. Therefore, a highly flexible construction set for designing electric devices is provided in which the deformed layer can be adapted for a certain application simply by defining its shape and configuration of its electrically conductive elements.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a rigid or flexible printed circuit board, an organic interposer, and an IC (integrated circuit) substrate. A component carrier may also be a hybrid board combining different ones of the above mentioned-types of component carriers.

In an embodiment, the component carrier is configured as one of the group consisting of a printed circuit board, and a substrate (in particular an IC substrate). For instance, it is possible to combine two PCBs, to combine two substrates, or to combine one PCB and one substrate for forming an electric device according to an exemplary embodiment of the invention.

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, a light guide, and an energy harvesting unit. However, other components may be used as well. For example, a magnetic element can be used as a component. Such a magnetic element may be a permanent magnetic element (such as a ferromagnetic element, an antiferromagnetic element or a ferrimagnetic element, for instance a ferrite base structure) or may be a paramagnetic element. However, the component may also be a further component carrier, for example in a board-in-board configuration. One or more components may be surface mounted and/or may be embedded in an interior of the electric device.

For example, the respective component carrier may be a stack or laminate of electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact.

In particular, the stack of layer structures may be connected with one another by lamination, i.e. the application of thermal energy and/or heat. In other words, the stack may be a laminate.

In the context of the present application, the term "layer structure" may particularly denote a continuous layer, a patterned layer or a plurality of non-consecutive islands within a common plane. In the context of the present application, the term "stack" may particularly denote an arrangement of multiple planar layer structures which are mounted in parallel on top of one another.

In an embodiment, the component carrier as well as the electric device is shaped as a plate. This contributes to the compact design, wherein the component carrier(s) nevertheless provide(s) a large basis for mounting components thereon. Furthermore, in particular a naked die as example for an embedded electronic component, can be conveniently embedded, thanks to its small thickness, into a thin plate such as a printed circuit board.

In an embodiment, the electrically insulating layer structures comprises at least one of the group consisting of resin (such as reinforced or non-reinforced resins, for instance epoxy resin or Bismaleimide-Triazine resin, more specifically FR-4, FR-5 or ABF®), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the electrically conductive layer structures comprise at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the dielectric matrix comprises at least one of the group consisting of polyimide, polyamide, and liquid crystal polymer. These materials and other flexible materials are capable of being thermo-deformable. In other words, it is possible to bring a layer made of one of the mentioned materials into a three-dimensional bending state and freeze the latter into this three-dimensional configuration by the application of heat. Highly advantageously, the mentioned materials are compatible with component carrier technology, in particular printed circuit board technology and may therefore be properly integrated into the electric device.

In an embodiment, the deformed layer extends in bent shape along at least one of the first structure and the second structure. In particular, different portions of the deformed layer may extend in parallel to a respective surface of a for instance plate-shaped or cuboid-shaped structure. By such a configuration, it is possible to very closely locate the structures to be coupled, for instance separated only by the thin deformed layer. It is also possible by such a bending architecture to functionalize the deformed layer in such a way that even a mechanical accommodation space may be defined in accordance with the specific shape and/or dimension of a respective one of the structures. For instance, a cavity may be defined by the three-dimensionally bent configuration of the deformed layer which fits to a shape and dimension of a respective one of the structures.

In an embodiment, the electric device comprises a third structure electrically coupled with at least one of the first structure and the second structure by the deformed layer. According to such a preferred embodiment, a third structure is added which is electrically coupled between the first structure and the second structure. Therefore, a package or module type electric device may be formed which has very short electric connection paths between the third structure and the first and/or second structure.

In an embodiment, the third structure comprises or consists of an electronic chip, in particular a semiconductor chip. For example, the third structure may be a semiconductor chip such as a processor or a memory. However, the third structure may be also any other kind of component carrier or component. Reference is made to the examples given above for the first and the second structure. All embodiments described herein for the first and second structure may also apply to the third structure. All embodiments described herein for the third structure may also apply to the first and second structure. It is also possible that the third structure is a component carrier such as a printed circuit board or an IC substrate, an interposer or the like. This large list of possible embodiments of the third structure shows the high flexibility involved by the concept according to an exemplary embodiment of the invention.

In an embodiment, the deformed layer is bent to form a cavity in which the third structure is inserted. In particular, the shape of the cavity may match to the shape of the third structure so that a form closure may be obtained when placing the third structure in the cavity. Such a cavity may define a specifically adapted accommodation volume for a respective one of the first, second and/or third structures and may have a support surface for supporting a main surface of the respective structure, as well as sidewalls for delimiting a lateral spatial dimension of the respective structure.

In an embodiment, the deformed layer is bent to contact both opposing main surfaces of the third structure. According to such a configuration, a complex bending architecture may be involved which allows to electrically contact both opposing main surfaces of the third (and/or the first and/or the second) structure via a single deformed layer. For instance, this may be accomplished by configuring the deformed layer or at least a portion thereof to assume a substantially U-shape for enabling the described coupling architecture.

In an embodiment, the electric device comprises an encapsulating medium at least partially encapsulating at least one of the group consisting of the deformed layer, the first structure, the second structure, and the third structure. By such an encapsulating medium, the configuration of the various structures to be interconnected may be fixed in place. At the same time, such an encapsulating medium may provide a mechanical protection of sensitive structures such as electronic chips. In one embodiment, the mentioned encapsulating medium may embed the third structure as well as at least a portion of the deformed layer while the first and second structure may remain externally exposed with regard to the encapsulation medium for electric contacting processes.

In an embodiment, the encapsulating medium is a mold medium. Such a mold medium may be for instance a viscous plastic which may be filled in a mold tool and may be cured by the application of thermal energy and/or pressure so that the mold medium solidifies and provides a mechanical protection shell as well as a dielectric decoupling structure preventing undesired electric paths in an interior of the electric device.

In an embodiment, the electric device comprises vertical interconnect structures, in particular vias, providing an electric connection between a respective one of the first structure and the second structure on the one hand and the deformed layer on the other hand. In order to provide for an access into an interior of the above described encapsulation medium, for example, the mentioned vias may be formed by laser processing or mechanically drilling. Subsequently, the so manufactured vias may be filled with electrically conductive material such as copper. Therefore, the electric coupling performance provided by the deformed layer may be accompanied by an additional electric wiring structure provided by the metal filed vias. Preferably, such vias extend from an exterior through a part of the encapsulation medium to thereby contribute to the electric connection paths between the first and/or second structure (extending beyond the encapsulation medium) on the one hand and the third structure and/or the deformed layer (which may be partially or completely within the encapsulation medium) on the other hand.

In an embodiment, the electric device comprises vertical interconnect structures, in particular vias, contributing to an electric connection between at least one of the first structure and the second structure on the one hand and the third structure on the other hand. In particular, it is possible that the complete electric path from the third structure to the first or second structure is composed of the electrically conductive elements in combination with the vertical interconnect structures. It is however also possible that the complete electric path from the third structure to the first or second structure is provided by the vertical interconnect structures alone. In yet another alternative, it is possible that the complete electric path from the third structure to the first or second structure is provided by the electrically conductive elements alone.

In an embodiment, at least one of the first structure and the second structure has a main surface along which at least part of the deformed layer extends. For instance, such a main surface may include electrically conductive connection elements of the respective first and/or second structure. Such electrically conductive connection elements may for instance be pads of a semiconductor chip or traces or pads of a component carrier such as a PCB, an IC substrate or an interposer. It should be mentioned that, additionally or alternatively to the mentioned vias, the vertical interconnect structures may also be embodied as metallic pillars, for instance copper pillars. Also such pillars may be integrated in an encapsulating medium.

In an embodiment, at least one of the first structure and the second structure has a sidewall along which at least part of the deformed layer extends. According to such an embodiment, it is also possible to electrically, thermally and/or mechanically contact sidewalls of a structure (such as a component). Guiding the deformed layer along the sidewall may in particular fulfil an electric connection purpose. Additionally or alternatively, it is however also possible that a portion of the deformed layer extending along a sidewall of the respective structure may contribute to a cooling function, for instance when a portion of the deformed layer extending along such a sidewall is made of a highly thermally conductive material such as copper. It is also possible to use a portion of the deformed layer extending along a sidewall for electromagnetic shielding purposes. In other words, the respective portion of the deformed layer may be made of an appropriate material (for instance a magnetic material) configured for preventing propagation of electromagnetic radiation between an interior and an exterior of the electric device. Such high frequency electromagnetic radiation may deteriorate functionality of components of an electronic environment. By taking the mentioned measure, it is also possible to establish an efficient electromagnetic shielding very close to the respective structure. Additionally, it should be said that it is also possible to provide the mentioned cooling and/or electromagnetic shielding and/or any further functional effect by portions of the deformed layer extending along a main surface of the respective structure.

In an embodiment, at least one of the first structure and the second structure has a through hole (such as a slit) through which the deformed layer extends. By configuring a respective one of the structures with a slit or the like, it is possible to guide the flexibly bendable deformed structure through the slit, recess or other kind of through-hole so as to establish a very short electric connection path between opposing main surfaces of the respective structure.

In an embodiment, the deformed layer is present in a defined permanently bent state in which the deformed layer is still elastically bendable. In particular, the dielectric matrix of the deformed layer may be configured so that an elastic property is maintained even after having fixed the general shape of the deformed layer, in particular thermally. This allows the deformed layer to adapt its shape concerning tolerances, temperature changes or other phenomena in the electric device without exerting excessive mechanical load to the constituents of the electric device.

In an embodiment, the electrically conductive elements form a redistribution structure. Such a redistribution structure, in particular redistribution layer, may comprise electrically conductive elements in the deformed layer which are configured to translate between relatively small dimensions of structures of one technology (such as pad dimensions and/or distances of a semiconductor component) and larger dimensions of structures of a second technology (such as dimensions of the component carrier world, such as the dimension of pads and traces of a PCB). In other words, an electric fan-out function may be provided by a redistribution structure integrated into the deformed layer.

In an embodiment, the first structure and the second structure are arranged above each another. Therefore, the described packaging architecture may vertically stack the structures.

In another embodiment, the first structure and the second structure are arranged side by side. Hence, it is also possible to arrange the structures to be electrically coupled juxtaposed or adjacent to one another, i.e. so that sidewalls of the respective structures face each other.

In an embodiment, the electrically conductive elements of the deformed layer form an impedance controlled electric connection circuitry. Thus, an impedance controlled electric connection circuitry may be provided with the mentioned configuration. Impedance may be denoted as the sum of the resistance and reactance (composed, in turn, of capacitance and inductance) of an electrical circuit. In particular in high speed AC circuits specifically the reactance can become significant. According to the described embodiment, an impedance control may be implemented by the deformed layer sandwiched between the structures. For instance, one of the electrically conductive elements of the deformed layer may be at electric ground potential, whereas an electric signal may be guided along another one of the electrically conductive elements of the deformed layer. As a result, an impedance controlled electric connection circuitry may be obtained.

In an embodiment, the method comprises thermo-deforming a thermal-deformable layer for forming the deformed layer to thereby accomplish the electric coupling. However, it is also possible to deform the layer by another or an additional impact, for instance the application of pressure.

In an embodiment, the method comprises electrically coupling the first structure with the second structure by the deformed layer by at least one of the group consisting of thermal compression bonding, directly pressing, and laser via connection. However, other connection techniques may be applied as well.

DETAILED DESCRIPTION OF EXEMPLARY EMBODIMENTS

Figure 1:
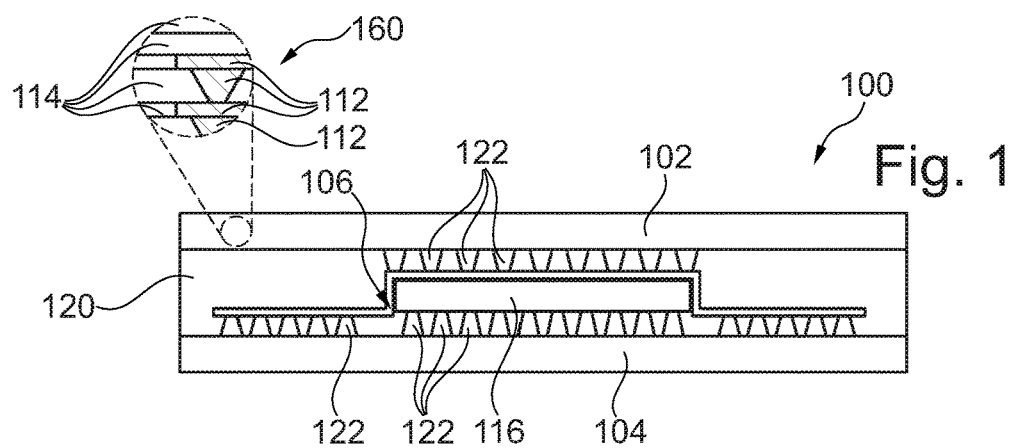
FIG. 1 illustrates a cross-sectional view of an electric device according to an exemplary embodiment of the invention.

The aspects defined above and further aspects of the invention are apparent from the examples of embodiment to be described hereinafter and are explained with reference to these examples of embodiment.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, an electric device is provided which electrically couples different structures via a deformed layer with electrically conductive elements therein. In particular, such an electric device can be configured as a multi component package with flexible thermoformed interconnect structures in form of the deformed layer.

Generally, z-axis interconnection is a process in component carrier technology which requires high accuracy alignment, as well as drill machines and precise drillers which may involve high effort and complexity. Beside this, via holes which may be conventionally used for the purpose of z-axis interconnecting do not have precisely defined impedance which can cause drawbacks in high speed transmission lines.

A z-axis interconnection with traces instead, as provided by exemplary embodiments of the invention in form of a (in particular thermo-) deformed layer with electrically conductive elements formed therein, may help to improve electric performance of a correspondingly manufactured electric device or package.

Additionally or alternatively to the use of metal plated drill holes, thermoformed flexible PCBs—as an example for the mentioned deformed layer—can be used to realize the interconnection between two or more different structures. The connection between a corresponding one of these structures and the deformed layer (in particular a thermoformed flex-PCB) can be achieved advantageously for instance by thermocompression bonding, i.e. by directly pressing with the structure, or by a laser via connection.

Conventionally, drilling is the most common way to achieve z-axis interconnections. In most cases the impedance jumps cause electrical problems.

According to exemplary embodiments of the invention, heavy mechanical drill holes, which are in many cases not that accurate in alignment and accuracy, can be largely avoided. Moreover, exemplary embodiments of the invention render impedance control of z-axis interconnections possible. Furthermore, exemplary embodiments of the invention may be implemented in substantially every build-up where different structures have to be connected in z-axis direction. Descriptively speaking, exemplary embodiments of the invention replace mechanical connections by thermoformed flexible PCBs which are implemented (for instance embedded) into a preferably rigid PCB.

Figure 2:
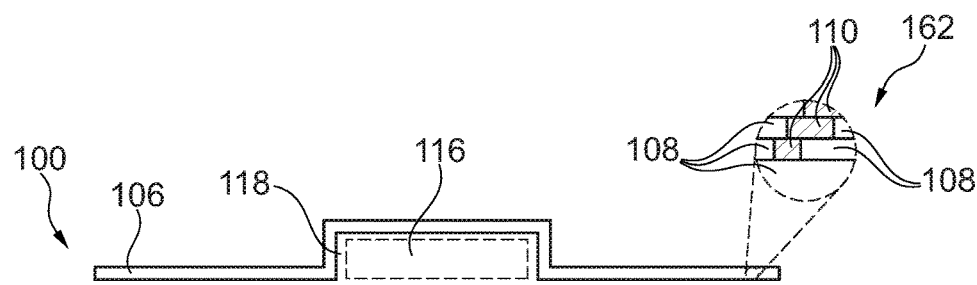
FIG. 2 is a cross-sectional view of constituents of the electric device of FIG. 1.
Figure 3:
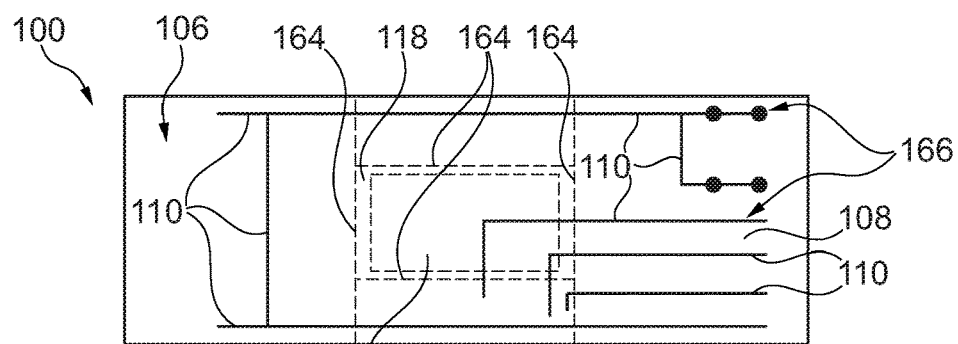
FIG. 3 is a plan view of constituents of the electric device of FIG. 1 and FIG. 2.

FIG. 1 illustrates a cross-sectional view of an electric device 100 according to an exemplary embodiment of the invention. FIG. 2 is a cross-sectional view of constituents of the electric device 100 of FIG. 1. FIG. 3 is a plan view of constituents of the electric device 100 of FIG. 1 and FIG. 2.

The electric device 100 comprises a first structure 102 which may be for instance a planar laminar type rigid component carrier such as a printed circuit board, PCB. Furthermore, the electric device 100 comprises a second structure 104 which may be for instance another planar laminar type rigid component carrier such as another PCB. The first structure 102 and the second structure 104 are vertically stacked. As can be taken from a detail 160 in FIG. 1, the component carrier forming the first structure 102 comprises a laminated stack composed of electrically conductive layer structures 112 (in particular copper vias and patterned and/or continuous copper foils) and electrically insulating layer structures 114 (which may comprise resin such as epoxy resin, optionally additionally comprising reinforcing particles such as glass fibers, more specifically prepreg or FR4). The other component carrier forming the second structure 104 may also comprise a laminated stack composed of electrically conductive layer structures 112 and electrically insulating layer structures 114.

A thermo-deformed layer 106 with a stepped shape is provided for accomplishing a vertical electric interconnection between the first structure 102 and the second structure 104. The thermo-deformed layer 106 is present in a defined permanently bent state in which the thermo-deformed layer 106 may be still elastically bendable. The thermo-deformed layer 106 may be interconnected between the first structure 102 and the second structure 104, preferably by thermocompression. The thermo-deformed layer 106 comprises a flexible dielectric matrix 108 (for example made of polyimide)

and electrically conductive elements 110 (which may be made of copper) formed therein (compare detail 162 shown in FIG. 2). The electrically conductive elements 110 may form a redistribution structure. The thermo-deformed layer 106 is vertically sandwiched between the first structure 102 and the second structure 104 and is spaced with regard to the first structure 102 and the second structure 104 also via respective vertical interconnect structures 122. Hence, the electrically conductive elements 110 in combination with the vertical interconnect structures 122 electrically couple the first structure 102 with the second structure 104. The thermo-deformed layer 106 extends in bent shape along the first structure 102 and the second structure 104.

Moreover, a third structure 116 (such as a semiconductor chip) is electrically coupled with both the first structure 102 and the second structure 104 by the electrically conductive elements 110 of the thermo-deformed layer 106 and by the vertical interconnect structures 122. Apart from this electric coupling task, the thermo-deformed layer 106 is bent to form a cavity 118 in which the third structure 116 matches and is inserted.

Beyond this, the electric device 100 comprises a mold-type encapsulating medium 120 which encapsulates the thermo-deformed layer 106 and the third structure 116 and in which the vertical interconnect structures 122 are formed. The first structure 102 and the second structure 104 are also in direct physical contact with the encapsulating medium 120.

According to FIG. 1, the thermo-deformed layer 106 may have a stepped configuration to thereby define cavity 118 as an accommodation volume of the third structure 116. In other words, the thermo-deformed layer 106 extends not only along a main surface of the plate-shaped third structure 116, but also laterally confines the third structure 116 by extending along the sidewalls of the third structure 116. At the same time, the illustrated shape of the thermo-deformed layer 106 ensures a vertically highly compact configuration of the electric device 100 and short connection paths in the vertical or z-direction. The electric device 100 is hence a flat module or package.

In the shown embodiment, the third structure 116 may for instance be a semiconductor chip having pads (not shown) both on an upper and a lower main surface thereof. The pads on the lower main surface are contacted with the second structure 104 via the vertical interconnect structures 122 which are here embodied as copper filled laser vias extending through the mold type encapsulating medium 120. The pads on the upper main surface of the third structure 116 are electrically coupled with the electrically conductive elements 110 within the thermo-deformed layer 106. The latter mentioned electrically conductive elements 110 of the thermo-deformed layer 106 are further connected via electrically conductive vertical through-connections 122 with the first structure 102.

As can be taken from the detail 160 in FIG. 1, the first structure 102 is configured as a printed circuit board, i.e. a component carrier comprising an interconnected stack of electrically conductive layer structures 112 (such as copper foils and copper vias) as well as electrically insulating layer structures 114 (such as prepreg or FR4 layers). The electrically insulating layer structures 114 may be, more generally, resin layers (for instance made of epoxy resin) which may optionally have reinforcing particles (such as glass fibres or glass spheres) therein. The second structure 104 may for instance be also a PCB or other component carrier, as the first structure 102. It is however also possible that the first and/or the second structure 102, 104 is a component such as a magnet, a further semiconductor chip, etc.

As can be taken from FIG. 1, a highly compact and highly efficient electric connection architecture with very short electric connection paths in particular in the vertical direction according to FIG. 1 is obtained.

The cross-sectional view of FIG. 2 shows in particular the internal composition of the thermo-deformed layer 106. The latter can be taken from detail 162 of FIG. 2. As shown, the thermo-deformed layer 106 may comprise one or more dielectric layers forming the dielectric matrix 108 made of an elastic and thermally deformable material such as polyimide. Within this one or more dielectric layers, the electrically conductive elements 110 are embedded, for instance copper structures. In the shown embodiment, electrically conductive elements 110 in different dielectric layers 108 have different dimensions, so that the arrangement shown in detail 162 functions as a redistribution layer (RDL) translating between the small pad dimensions of the semiconductor world and the larger electric dimensions of the PCB world.

By the three-dimensional bending of the thermo-deformed layer 106 according to FIG. 2, the cavity 118 for accommodating the third structure 116 is formed, thereby providing a mechanical guiding function in addition to the electric coupling function.

FIG. 3 shows a plan view of the architecture illustrated in FIG. 2. Bending lines 164 in FIG. 3 illustrate positions where the thermo-deformed layer 106 may be bent in order to define the cavity 118 and in order to provide the electric coupling functionality described above. FIG. 3 moreover shows electrically conductive connection paths 166 within the thermo-deformed layer 106 which may be formed by the electrically conductive elements 110.

FIG. 4 to FIG. 7 illustrate cross-sectional views of electric devices 100 according to other exemplary embodiments of the invention.

Figure 4:
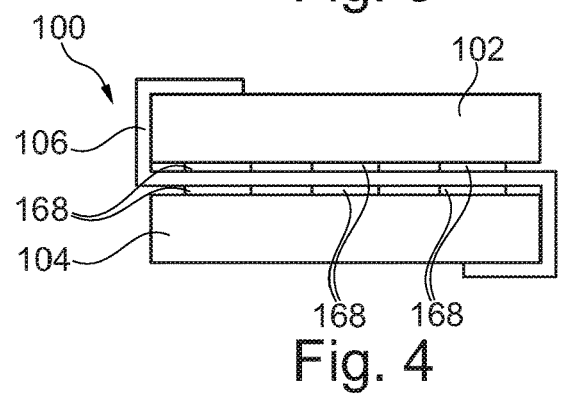
FIG. 4, FIG. 5, FIG. 6 and FIG. 7 illustrate cross-sectional views of electric devices according to other exemplary embodiments of the invention.

Referring to FIG. 4, both the first structure 102 and the second structure 104 has a respective sidewall along which a respective portion of the thermo-deformed layer 106 extends. In the embodiment shown in FIG. 4, the thermo-deformed layer 106 assumes a substantially S-shape to thereby extend along both main surfaces as well as side wall surfaces of the structures 102, 104. An extremely compact electric device 100 with highly efficient electric coupling may therefore be obtained. It is also possible that electric signals or electric energy is transported along the S-shape of the correspondingly bent thermo-deformed layer 106.

Figure 5:
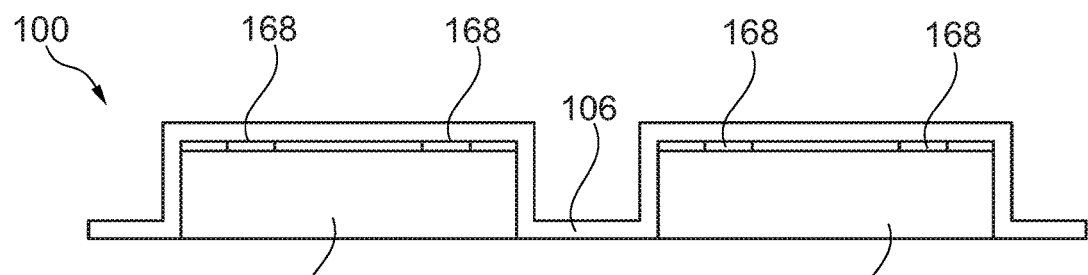

Referring to FIG. 5, the first structure 102 and the second structure 104 are arranged side by side, i.e. are located horizontally adjacent to one another. While the various structures 102, 104, 116 have been arranged on top of one another, i.e. have been vertically stacked, in the previously described embodiments, FIG. 5 shows an embodiment in which first structure 102 and second structure 104 are electrically connected via the three-dimensionally thermo-deformed layer 106 in a side by side arrangement.

In embodiments, the thermoformed material in combination with the copper on top and/or bottom can also transport heat.

Figure 6:
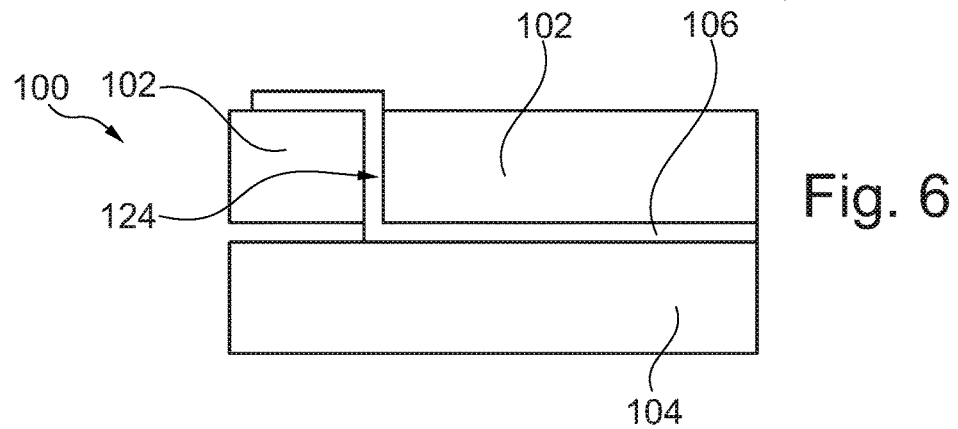

Referring to FIG. 6, the first structure 102 has a slit-shaped through hole 124 through which the thermo-deformed layer 106 extends. The embodiment of FIG. 6 has the advantage of particularly short electric connection paths thanks to the through-hole 124 formed in the first structure 102 in combination with the thermo-deformed layer 106. The three-dimensionally bent thermo-deformed layer 106 is guided along exterior surfaces of the first structure 102 and the second structure 104 and extends through the through-hole 124 for providing an extremely short electric connection path.

Figure 7:
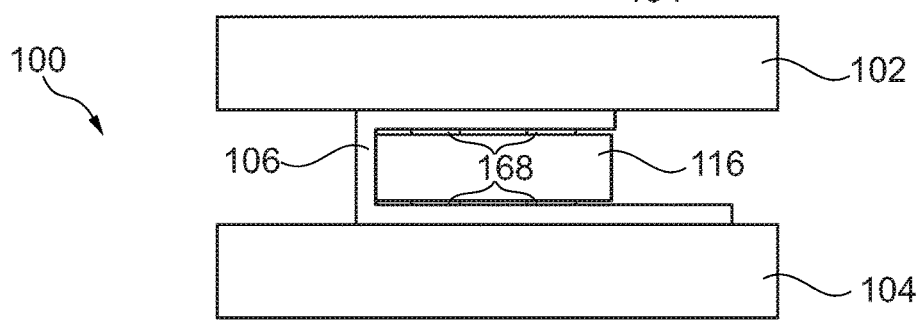

Referring to FIG. 7, the thermo-deformed layer 106 is bent in a U-shaped way to contact both opposing main surfaces of the third structure 116. With the U-shaped configuration according to FIG. 7, the shown electric device 100 allows a simultaneous contacting of pads 168 on both opposing main surfaces of the third structure 116. Also this embodiment has the advantage of a particularly short electric connection path between the first structure 102 and the second structure 104 as well as between the two opposing main surfaces of the third structure 116.

Figure 8:
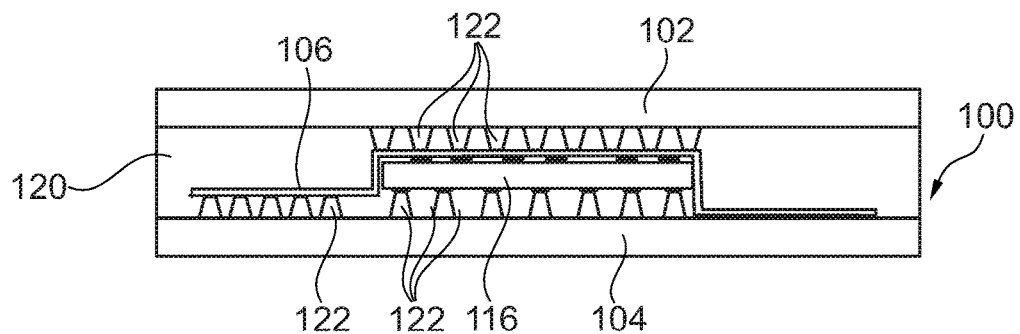
FIG. 8 illustrates a cross-sectional view of an electric device according to another exemplary embodiment of the invention similar to FIG. 1.

FIG. 8 illustrates a cross-sectional view of an electric device 100 according to another exemplary embodiment of the invention similar to FIG. 1.

It should be noted that the term "comprising" does not exclude other elements or steps and the "a" or "an" does not exclude a plurality. Also elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. An electric device, comprising:
   a first structure;
   a second structure; and
   a deformed layer comprising a dielectric matrix and a plurality of electrically conductive elements formed therein;
   wherein the plurality of electrically conductive elements provides a plurality of vertical electric connections through the deformed layer to electrically couple the first structure with the second structure.

2. The electric device according to claim 1, wherein the deformed layer is a thermo-deformed layer.

3. The electric device according to claim 1, wherein at least one of the first structure and the second structure comprises one of the group consisting of a component carrier and a component.

4. The electric device according to claim 3, further comprising at least one of the following features:
   the component carrier is shaped as a plate;
   the component carrier is configured as a printed circuit board or a substrate;
   the component comprises at least one of the group consisting of an electronic component, an electrically non-conductive and/or electrically conductive inlay, a heat transfer unit, an energy harvesting unit, an active electronic component, a passive electronic component, an electronic chip, a package, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a light guiding element, a further component carrier and a logic chip.

5. The electric device according to claim 3, wherein the component carrier comprises a stack comprising at least one electrically conductive layer structure and at least one electrically insulating layer structure.

6. The electric device according to claim 5, further comprising at least one of the following features:
   the at least one electrically conductive layer structure comprises at least one of the group consisting of copper, aluminum, nickel, silver, gold, palladium, and tungsten, any of the mentioned materials being optionally coated with supra-conductive material such as graphene;
   the at least one electrically insulating layer structure comprises at least one of the group consisting of resin, reinforced or non-reinforced resin, epoxy resin or Bis-maleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide.

7. The electric device according to claim 1, wherein the dielectric matrix comprises at least one of the group consisting of polyimide, polyamide, and liquid crystal polymer.

8. The electric device according to claim 1, wherein the deformed layer extends in bent shape along at least part of at least one of the first structure and the second structure.

9. The electric device according to claim 1, wherein the electric device comprises a third structure electrically coupled with at least one of the first structure and the second structure by the deformed layer.

10. The electric device according to claim 9, wherein the third structure comprises or consists of a semiconductor chip.

11. The electric device according to claim 9, wherein the deformed layer is bent to form a cavity in which the third structure is inserted.

12. The electric device according to claim 9, wherein the deformed layer is bent to contact both opposing main surfaces of the third structure.

13. The electric device according to claim 9, wherein the electric device comprises vertical interconnect structures contributing to an electric connection between at least one of the first structure and the second structure on the one hand and the third structure on the other hand.

14. The electric device according to claim 1, wherein the electric device comprises an encapsulating medium at least partially encapsulating at least part of at least one of the group consisting of the deformed layer, the first structure, and the second structure.

15. The electric device according to claim 14, wherein the encapsulating medium is a mold medium.

16. The electric device according to claim 1, wherein the electric device comprises vertical interconnect structures providing an electric connection between a respective one of the first structure and the second structure on the one hand and the deformed layer on the other hand.

17. The electric device according to claim 1, comprising at least one of the following features:
   wherein at least one of the first structure and the second structure has a main surface along which at least part of the deformed layer extends;
   wherein at least one of the first structure and the second structure has a sidewall along which at least part of the deformed layer extends;
   wherein at least one of the first structure and the second structure has a through hole through which the deformed layer extends;

wherein the deformed layer is present in a defined permanently bent state in which the deformed layer is still elastically bendable;

wherein the electrically conductive elements form a redistribution structure;

wherein the first structure and the second structure are arranged above each another;

wherein the first structure and the second structure are arranged side by side;

wherein the electrically conductive elements of the deformed layer form an impedance controlled electric connection circuitry;

wherein the dielectric matrix of the deformed layer comprises at least one of the group consisting of a thermoplastic material, Polyolefins such as Polypropylene, Vinyl-Polymers, Styrene based Polymers such as Polystyrene, Polyacrylates such as Polymethylmetaclylate, Polyacetals such as Polyoxymetlylene, Fluoropolymers such as Polytetrafluoroethylene, Polyamides including aromatic polyamides such as Polyphthalamide, Polycarbonate and Derivatives, Polyesters such as Polyethylene terephthalate, Liquid Crystalline Polymers, Polyarylether such as Polyphenyleneether, Polyphenylenesulfone, Polyarylethersulfone, Polyphenylensulfid, Polyetherketones such as Polyetheretherketone, Polyimide, Polyetherimide, and Polyamidimide.

18. A method of manufacturing an electric device, wherein the method comprises:
providing a first structure;
providing a second structure;
providing a deformed layer between the first structure and the second structure, the deformed layer comprising a dielectric matrix and a plurality of electrically conductive elements formed therein; and
electrically coupling the first structure with the second structure by the plurality of electrically conductive elements which provides a plurality of vertical electrical connections through the deformed layer.

19. The method according to claim 18, wherein electrically coupling is accomplished by thermo-deforming a thermal-deformable layer for forming the deformed layer.

20. The method according to claim 19, wherein electrically coupling the first structure with the second structure by the deformed layer by at least one of the group consisting of thermal compression bonding, directly pressing, and laser via connection.

* * * * *